United States Patent
Biernacki

(10) Patent No.: US 6,236,145 B1
(45) Date of Patent: May 22, 2001

(54) HIGH THERMAL RESISTIVITY CRYSTAL RESONATOR SUPPORT STRUCTURE AND OSCILLATOR PACKAGE

(75) Inventor: John Biernacki, Glendale Heights, IL (US)

(73) Assignee: CTS Corporation, Elkhart, IN (US)

( * ) Notice: Subject to any disclaimer, the term of this patent is extended or adjusted under 35 U.S.C. 154(b) by 0 days.

(21) Appl. No.: 09/515,344

(22) Filed: Feb. 29, 2000

(51) Int. Cl.[7] .................................................. H01L 41/04
(52) U.S. Cl. ............................................ 310/346; 310/348
(58) Field of Search ..................................... 310/346, 348

(56) References Cited

U.S. PATENT DOCUMENTS

| | | | |
|---|---|---|---|
| 3,735,166 | * | 5/1973 | Bradley ................................. 310/352 |
| 3,916,348 | * | 10/1975 | Toda et al. ............................ 333/155 |
| 3,918,013 | * | 11/1975 | Lungo ................................... 333/187 |
| 3,980,022 | * | 9/1976 | Lungo ................................... 102/210 |
| 4,216,401 | * | 8/1980 | Wagner ............................. 310/313 R |
| 4,266,157 | * | 5/1981 | Peters .................................... 310/353 |
| 4,292,562 | * | 9/1981 | Feder .................................... 310/348 |
| 4,471,259 | * | 9/1984 | Stoermer et al. ...................... 310/353 |
| 4,478,677 | | 10/1984 | Chen ........................................ 216/65 |
| 4,626,732 | * | 12/1986 | Debaisieux et al. ................... 310/348 |
| 4,748,367 | * | 5/1988 | Bloch et al. ........................... 310/343 |
| 5,030,875 | * | 7/1991 | Knecht .................................. 310/346 |
| 5,917,272 | * | 6/1999 | Clark et al. ........................... 310/343 |

* cited by examiner

Primary Examiner—Nestor Ramirez
Assistant Examiner—Peter Medley
(74) Attorney, Agent, or Firm—Mark P. Bourgeois; Mark W. Borgman

(57) ABSTRACT

A crystal support structure and oscillator package for ovenized oscillators that has improved thermal isolation of the crystal. The support has a glass tubular wall with helical coils. Airgaps are formed circumferentially around the wall. A conductive metal layer is located over the surface of the wall. One end of the wall is supporting and electrically connected to a crystal resonator. Another end of the wall is attached to and electrically connected to a substrate. The crystal support forms an electrical path between the crystal resonator and the substrate and thermally isolates the crystal resonator from the substrate.

17 Claims, 7 Drawing Sheets

HIGH THERMAL RESISTIVITY CRYSTAL RESONATOR SUPPORT STRUCTURE AND OSCILLATOR PACKAGE

BACKGROUND OF THE PREFERRED EMBODIMENT(S)

1. Field of the Preferred Embodiment(s)

This invention generally relates to oscillators which provide a stable reference source or frequency in computers or other electronic equipment. Specifically, there is a resonating device support structure and oscillator package which simultaneously provides mechanical and thermal isolation between a crystal resonating device and a circuit board. The support is enhanced to improve thermal isolation.

2. Description of the Related Art

Various devices are well known for providing a reference frequency or source. Such devices are called oscillators. The oscillator typically has a quartz crystal source and also has electronic compensation circuitry to stabilize the output frequency. Ovenized oscillators heat the oscillator to a uniform temperature to obtain a more stable output frequency. The oscillators have been packaged on various support structures and in housings such as metal cans.

In order to minimize the quantity of electric power consumed by the oven assembly, it is necessary to maximize the thermal path resistance between the heated object (the crystal resonator) and the ambient environment. In a typical embodiment, it is desired to maintain the crystal resonator at a specific temperature in the range 70 to 90 degrees Centigrade, while the ambient temperature can go as low as −40 to −55 degrees C.

The biggest cause of power consumption in an ovenized crystal controlled oscillator is the need to electrically maintain the crystal resonator at a temperature corresponding to the so-called turnover temperature, i.e. a temperature where the slope of frequency deviation versus temperature characteristic curve approaches zero. In accordance with Fourier's law of heat conduction, sufficient power must be provided to heat the resonator and its attached material structures to counterbalance the continuous heat loss through those supporting structures to the ambient temperature surfaces.

There is a current unmet need for a crystal support structure having a significantly higher thermal resistivity. The heat flux Q per unit time (power) is related to the temperature drop dT and thermal resistance $\Theta$ by the following Ohms law type relationship: $Q=dT/\Theta$. Here, Q is analogous to electric current, dT is analogous to electric voltage, and $\Theta$ is analogous to electric resistance. In order for an OCXO oven to consume less than 1 mW continuous in a 100 degree C. thermal gradient, the thermal resistance between the crystal resonator and the ambient enclosure must be at least 100,000° C./Watt.

Another disadvantage of many present art crystal support designs is that the support imparts a residual mechanical stress to the resonator which results in undesired frequency shifts of the resonator. If this stress and frequency shift changes slowly over time, the oscillator or filter is said to exhibit "aging". Aging in practical oscillators has been attributed to many effects. These effects may be broadly classified into three categories: 1) aging due to changes in the materials of the resonator itself, 2) changes in the environment surrounding the resonator, or the enclosure itself, which results in mass being deposited onto or removed from the resonator, 3) aging due to changes in the mechanical stress imparted to the resonator by the supports or enclosure.

One approach to indirectly measuring the effect of support structure induced stresses on the crystal resonator is to conduct the following experiment:

Thermally cycle the crystal in it's supports and housing. Another sample is used as a control group. If aging tests reveal a significant difference in the frequency drift over time between the experimental group and the control group, then it can be said that support induced stress on the resonator exists. A more rapid version of this experiment is known as cryoprocessing, is especially effective when Kovar, Invar and other austentite steel alloys are used for the supports, or in the baseplate. The existence of residual stresses can be indirectly measured by performing an experiment on two groups of sealed crystal resonators. The first group is not subjected to thermal cycling, the second group is thermally cycled from room temperature, down some low temperature (such as −150° C.), then back up to a high temperature (such as +125° C.), and then back to room temperature. In some instances, this temperature cycle may be repeated more than once. The rate of change of temperature is typically less than 0.5° C./min. Aging tests are then performed on both the control group (non cycled) and experimental group (temp. cycled), and if there is a difference in the aging of the two groups, then it can be said that a stress relaxation occurred in the cryoprocessed group. It is desirable to have a support structure which does not require the additional screening or manufacturing step of cryoprocessing to insure a given aging characteristic.

DESCRIPTION OF THE RELATED ART

Examples of patents and publications related to the present invention are as follows, wherein each patent or publication is herein incorporated by reference in its entirety for related and supporting teachings:

U.S. Pat. No. 5,917,272 is an oven-heated crystal resonator and oscillator assembly.

U.S. Pat. No. 4,478,677 is a laser induced dry etching of vias in glass with non-contact masking The foregoing patents reflect the state of the art of which the applicant is aware and are tendered with the view toward discharging applicants' acknowledged duty of candor in disclosing information that may be pertinent in the examination of this application. It is respectfully stipulated, however, that none of these patents teach or render obvious, singly or when considered in combination, applicants' claimed invention.

SUMMARY OF THE PREFERRED EMBODIMENT(S)

It is a feature of the invention to provide a crystal support structure and oscillator package for ovenized oscillators that has improved thermal isolation of the crystal.

A further feature of the invention is to provide a high thermal resistivity crystal support for an oscillator, the support includes a glass tubular wall that has an airgap that is circumferenfially located around the wall. The airgap forms in the wall helical coils. A conductive metal layer is located over the surface of the wall. One end of the wall is adjacently supporting and electrically connected to a crystal resonator. Another end of the wall is attached to and electrically connected to a substrate. The crystal support forms an electrical path between the crystal resonator and the substrate. The crystal support thermally isolates the crystal resonator from the substrate. The crystal resonator is connected to the support by a conductive adhesive. The substrate is also connected to the support by a conductive adhesive.

The invention resides not in any one of these features per se, but rather in the particular combination of all of them herein disclosed and claimed. Those skilled in the art will appreciate that the conception, upon which this disclosure is based, may readily be utilized as a basis for the designing of other structures, methods and systems for carrying out the several purposes of the present invention. Further, the abstract is neither intended to define the invention of the application, which is measured by the claims, neither is it intended to be limiting as to the scope of the invention in any way.

BRIEF DESCRIPTION OF THE DRAWINGS

These and other features of the invention can best be understood by the following description of the accompanying drawings as follows.

FIG. is a side view of another embodiment of a wire spring type crystal support.

Figure 6:
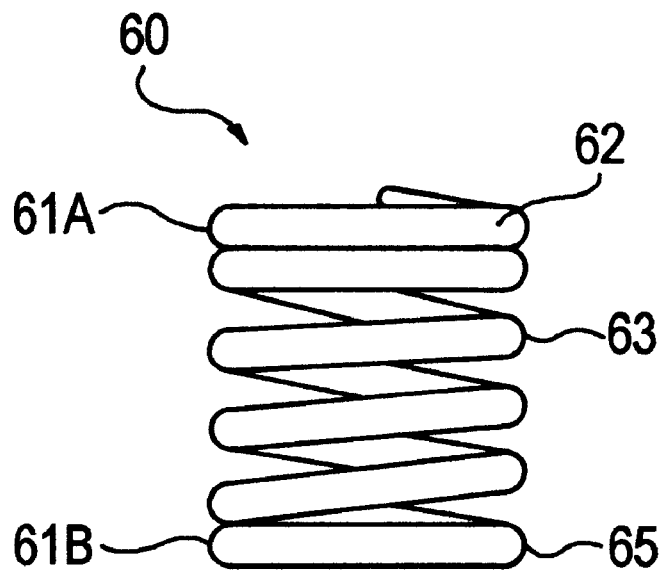
Figure 7:
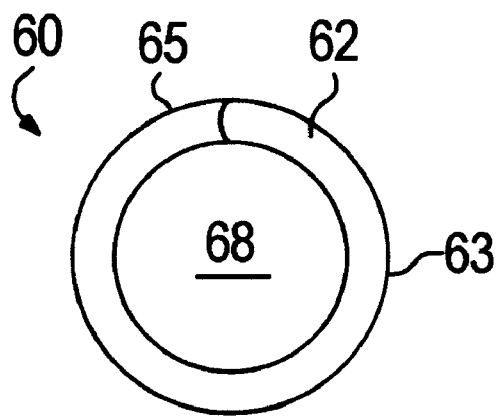

FIG. 7 is a top view of FIG. 6.

Figure 8:
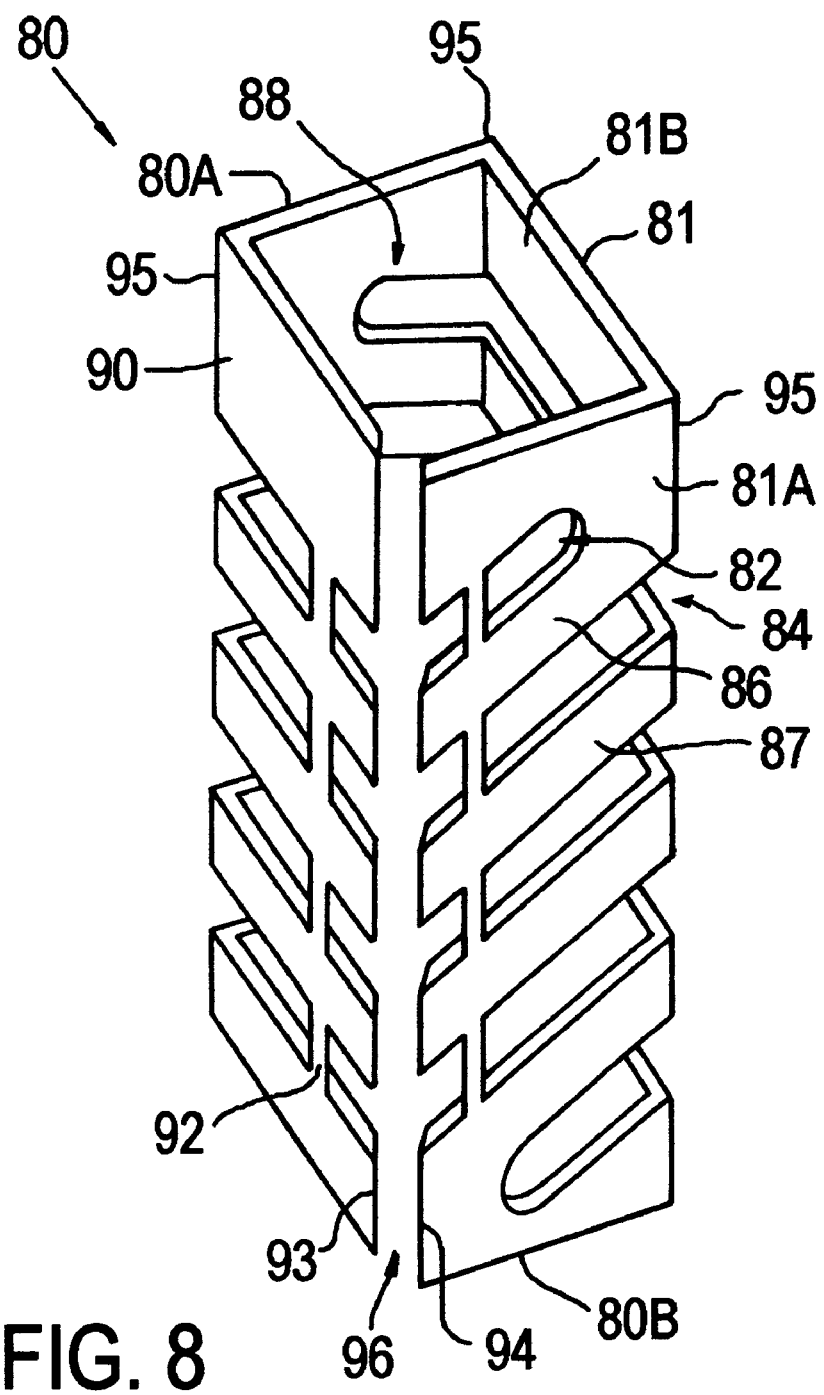

FIG. 8 is a perspective view of another embodiment of a square parallelepiped crystal support.

Figure 9:
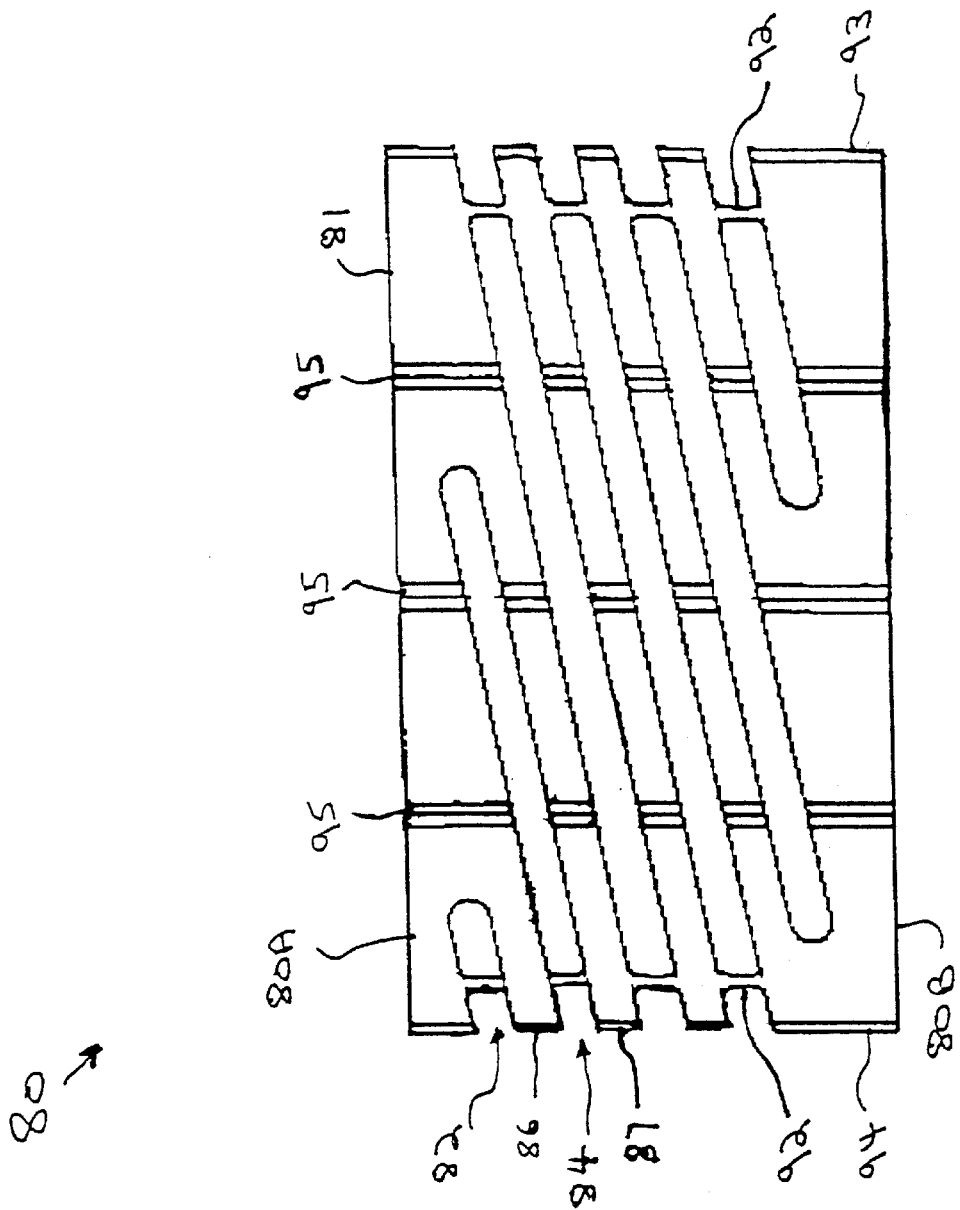

FIG. 9 illustrates the crystal support of FIG. 8, in which the 3-dimensional surface logically mapped onto a 2 dimensional surface.

It is noted that the drawings of the invention are not to scale. The drawings are merely schematic representations, not intended to portray specific parameters of the invention. The drawings are intended to depict only typical embodiments of the invention, and therefore should not be considered as limiting the scope of the invention. The invention will be described with additional specificity and detail through the accompanying drawings.

DETAILED DESCRIPTION

Figure 1:
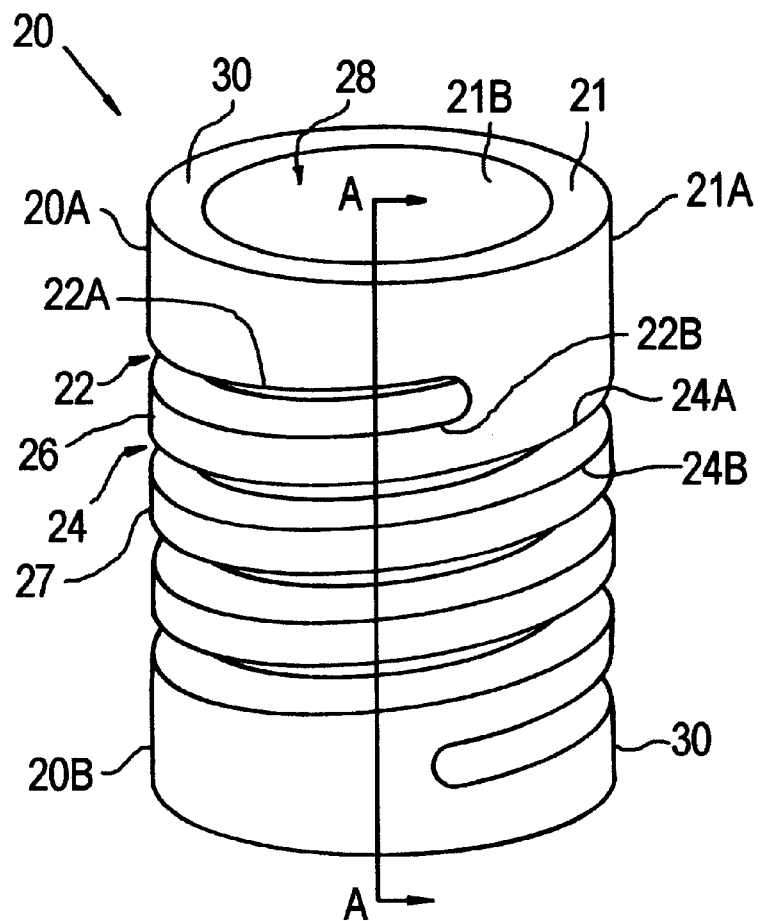
FIG. 1 is a perspective view of the preferred embodiment of the crystal resonator support.
Figure 2:
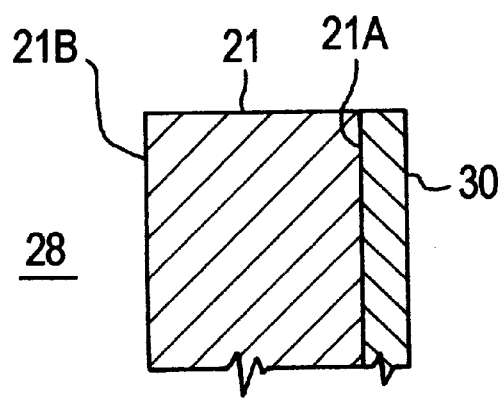
FIG. 2 is a section view along an upper portion of section A—A of FIG. 1.

Referring to FIGS. 1 and 2, a tubular or cylindrical glass double helix spring crystal resonator support 20 is shown. Support 20 has a flat top end 20 A and a flat bottom end 208. A circular wall 21 surrounds a bore 28. Wall 21 is perpendicular to ends 20A and 20B. Wall 21 has an outer surface 21A and an inner surface 21B. A pair of circular air gaps 22 and 24 are formed in wall 21. Air gap 22 has an upper surface 22A and a lower surface 22B. Air gap 24 has an upper surface 24A and a lower surface 24B. Airgaps 22 and 24 define circumferential helical coils 26 and 27 in wall 21. Such a spring is referred to as a double start spring, since is has two points where the helical coils start. Helical coils or helixes 26 and 27 go around support 20 but do not intersect each other. Support 20 is provided with a thin film, 1000 angstroms to 5000 angstroms thick, of a conductive plating layer 30 such as copper, nickel or gold to provide a conductor of electrical current along the support. Layer 30 would be deposited by conventional metal application techniques such as sputtering, evaporation or electroless plating. Other methods of applying a thin electrically high conductivity layer to the surface may occur to those skilled in the art.

Support 20 is typically made of commercially available borosilicate glass. Support 20 is made by machining notches or cuts in the walls of a thin glass capillary tube. After the desired material is removed, what is left is a support 20 in which the helixes 26 and 27 have an approximately square cross section. Support 20 has a high thermal resistance to heat flowing from one end to the other. Another advantage is the flat ends 20A and 20B allow the support to be placed upright on a flat surface, and the axis of the support will be perpendicular to the surface. Support 20 also has the advantage that removal of material from the glass cylinder can be performed in a manner which does not create residual forces that can be transmitted to the crystal resonator.

Figure 3:
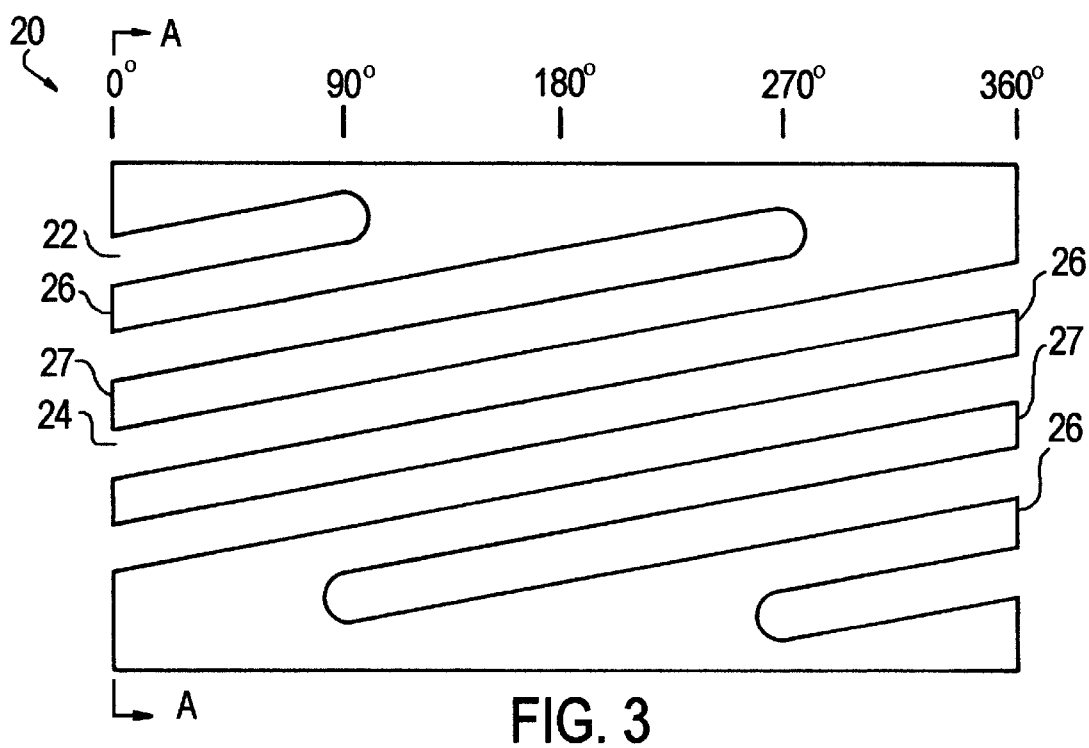
FIG. 3 illustrates the crystal support of FIG. 1, in which the 3-dimensional surface isopologically mapped onto a 2 dimensional surface.

Referring to FIG. 3, crystal support 20 of FIG. 1, is shown in which the 3-dimensional surface is topologically mapped onto a 2 dimensional surface. In other words, the support 20 is cut along section line A—A and laid out flat in order to see the entire outer surface 21A at once. As can be seen in this view, the starts of helixes 26 and 27 are spaced equidistantly or 180 degrees around the circumference of the support.

Figure 4:
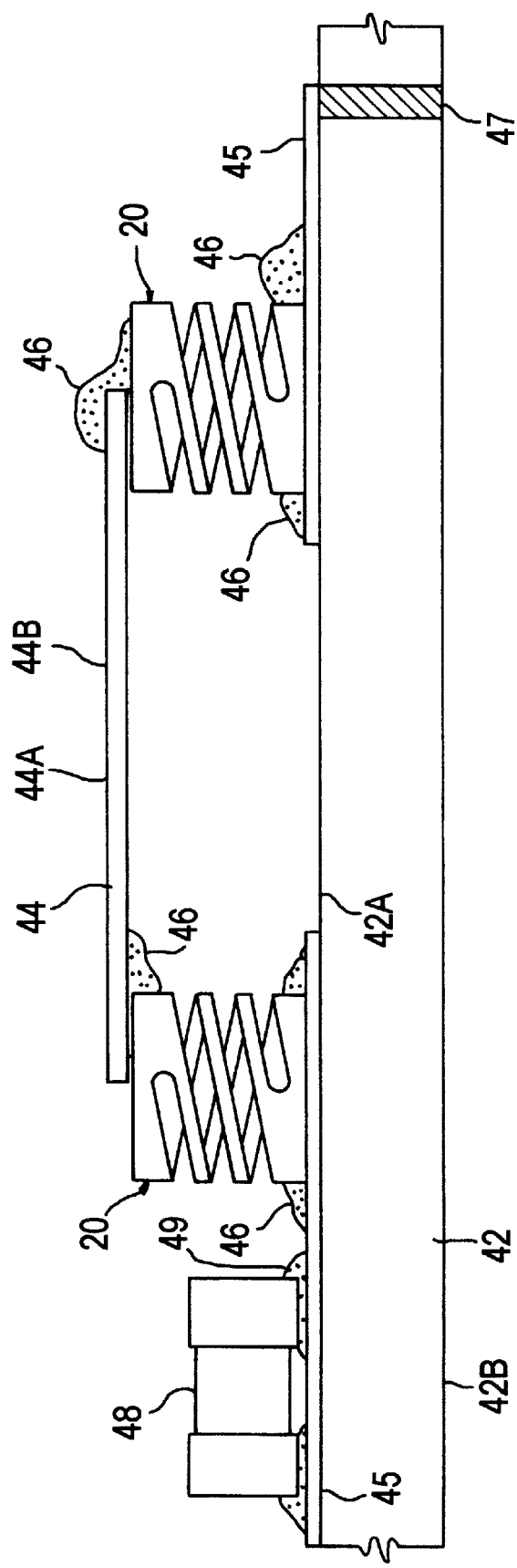
FIG. 4 is a side view of an oscillator package using the crystal support of FIG. 1.
Figure 5:
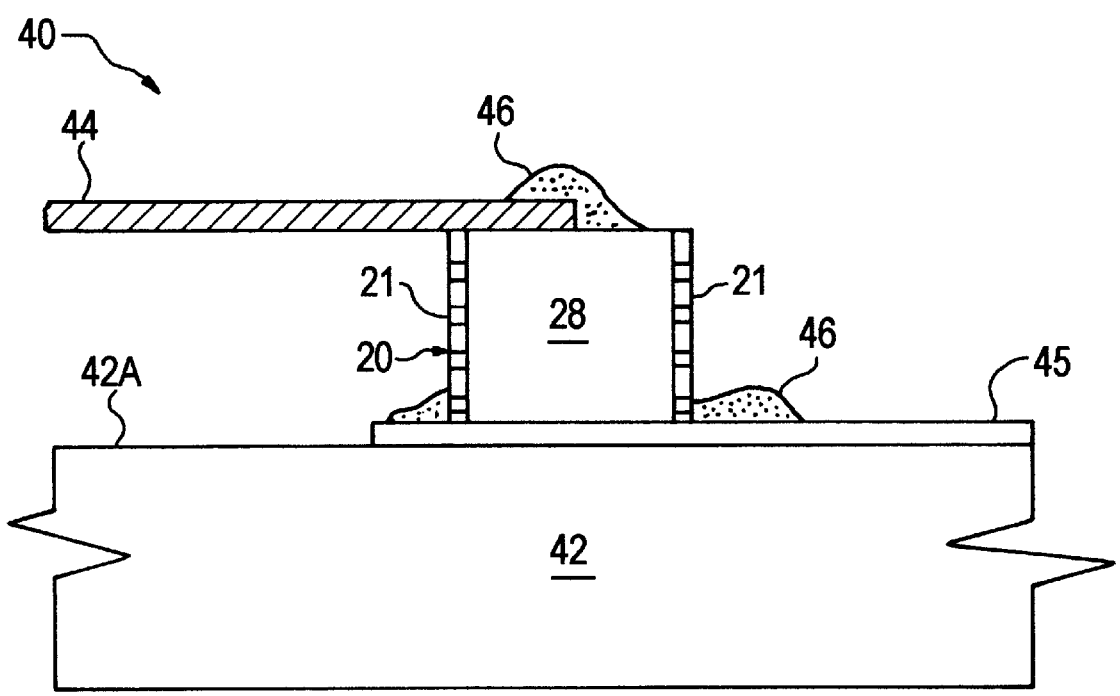
FIG. 5 is a partially cross-sectional view of FIG. 4.

Referring to FIGS. 4 and 5, a side view and cross-sectional view of an oscillator package 40 using the crystal support 20 is shown. A pair of crystal supports 20 are used to support a crystal resonator 44 a fixed distance above a substrate 42. Substrate 42 typically is a ceramic substrate such as alumina, aluminum nitride beryllium oxide or glass. However, it could also be a printed circuit board. Substrate 42 has a top surface 42A and a bottom surface 42B. Crystal resonator 44 is typically a quartz crystal, however, it can also be another piezoelectrically active material such as lithium niobate. Other devices may be used in place of resonator 44. Such alternative devices include Quartz monolithic filters (QMF), Surface Acoustic Wave devices (SAW), microelectromechanical system chips (MEMS) and Microcalorimetry transducers. The crystal resonator 44 has an upper surface 44A and a lower surface 44B. An electrode (not shown) on upper surface 44A is attached to the top end 20A of the crystal support 20 by a commercially available conductive adhesive 46. Such adhesives are conductive polyimide or conductive silicone RTV adhesive.

Similarly, another electrode (not shown) on the bottom surface 44B is attached to end 20A on the other support 20. If a pair of crystal supports 20 are used to support crystal resonator 44, the resonator 44 will rest parallel to substrate 42.

An electrically conductive circuit line 45 is located on surface 42A. Crystal supports 20 are attached to substrate 42 by means of additional conductive adhesive 46. Conductive adhesive 46 electrically connects the support posts 20 to circuit line 45. Other signal conditioning components 48, that are conventionally used in oscillators are attached to another end of line 45. A solder 49 or conductive adhesive is used to attach components 48 to circuit line 45. If desired, an electrically conductive via 47 can be used to connect the circuit line 45 to other circuit lines or components on bottom surface 42B.

Referring to FIGS. 6 and 7, another embodiment of a glass wire spring type crystal support 60 is shown. Circular shaped support 60 is fabricated from a glass wire or fiber 62 that is wound into coils 63 around a bore 68. Support 60 has a top end 61A and a bottom end 61B. Support 60 is provided with a thin film, 1000 angstroms to 5000 angstroms thick, of a conductive plating layer 65 such as copper, nickel or gold to provide a conductor of electrical current along the support. Layer 30 would be deposited by conventional metal application techniques such as sputtering, evaporation or electroless plating.

Referring to FIGS. 8 and 9, another embodiment of a glass square parallelepiped crystal support 80 is shown. Support 80 is the square parallelepiped equivalent of the cylindrical support 20 of FIG. 1. Support 80 has a flat top end 80A and a flat bottom end 80B. A square wall 81 surrounds a bore 88. Wall 81 is perpendicular to ends 80A and 80B. Wall 81 has an outer surface 81A and an inner surface 81B. A pair of circular air gaps 82 and 84 are formed in wall 81. Airgaps 82 and 84 define circumferential helical coils 86 and 87 in wall 81. Helical coils 86 and 87 go around support 80 but do not intersect each other. Support 80 is provided with a thin film, 1000 angstroms to 5000 angstroms thick, of a conductive plating layer 90 such as copper, nickel or gold to provide a conductor of electrical current along the support. Layer 90 would be deposited by conventional metal application techniques such as sputtering, evaporation or electroless plating. Layer 90 could also be a thick film metal. Support 80 has sacrificial bridges 92, which are removed after manufacturing. FIG. 9 shows crystal support 80 in which the 3-dimensional surface is topologically mapped onto a 2 dimensional surface. In other words, the support 80 is unfolded at joint 96 and laid out flat in order to see the entire outer surface 81A at once. As can be seen in this view, the starts of helixes 86 and 87 are spaced equidistantly or 180 degrees around the circumference of the support.

Support 80 is fabricated by etching the pattern shown in FIG. 9 on a flat commercially available glass surface such as borosilicate glass using techniques known to the micromachining art, and then removing the planar structure from its substrate and folding along hinge lines 95. The final operations include joining edges 94 and 94 into joint 96 and removing the sacrificial tie bars 92. The hinge lines 95 result from etching through the low thermal conductivity glass so that only 20% or less of the original material thickness remains. This thin cross section can be flexed without breakage to form the parallelepiped support 20. Final assembly consists of anodically bonding the beveled edges 93 and 94, and then removing the sacrificial supports 92. The two dimensional micromachined assembly is converted into a three dimensional structure by forming 90° folds at each of the flexure hinges 95, and then joining edges 93 and 94 with fired glass frit or adhesive to form joint 96. The last assembly step is to remove the sacrificial bridges 92, which would provide an unintended thermal shunt if not removed.

Other support configurations such as pentagonal and hexagonal cylinders could be also formed. Support 80 could also be made from silicon dioxide or non-crystalline quartz. However, glasses are preferred owing to their low thermal conductivity.

Remarks on the Preferred Embodiment(s)

The largest cause of power consumption in an ovenized crystal controlled oscillator is the need to electrically maintain the crystal resonator at a temperature corresponding to the so-called turnover temperature, i.e. a temperature where the slope of frequency deviation versus temperature characteristic curve approaches zero. In accordance with Fourier's law of heat conduction, sufficient power must be provided to heat the resonator and its attached material structures to counterbalance the continuous heat loss through those supporting structures to the ambient temperature surfaces.

There is need for a crystal support structure having a significantly higher thermal resistivity than the prior art. The heat flux Q per unit time (power) is related to the temperature drop dT and thermal resistance $\Theta$ by the following Ohms law type relationship: $Q=dT/\Theta$. Here, Q is analogous to electric current, dT is analogous to electric voltage, and $\Theta$ is analogous to electric resistance. In order for an OCXO oven to consume less than 1 mW continuous in a 100 degree C. thermal gradient, the thermal resistance between the crystal resonator and the ambient enclosure must be at least 100,000° C./Watt.

A calculation of the thermal resistance of prototype crystal supports in the present invention are shown. The configurations of FIGS. 1–9 are capable of meeting the design goal of greater than $1\times10^{\wedge}5°$ C./Watt thermal resistance. In a typical application of the invention, two or more support structures are used with each crystal resonator. The two supports act as thermal resistances in parallel, so that the total thermal resistance from crystal to mounting surface will be ½ of the numerical value shown in the table. Reduction of the effective thermal resistance due to radiation from the helical coils, and radiation between helical coil turns, is negligible compared with the conduction.

TABLE 1

| FIG. No. | Name/ Description | material | k Thermal conductivity Watt/° C. | L Thermal path length | A Cross section area $m^2$ | Notes | Thermal Resistance $\Theta = L/kA$ ° C./Watt |
|---|---|---|---|---|---|---|---|
| 6,7 | Glass fiber support 60 | Borosilicate glass | 1.6 | 9.57 mm | $1.27 \times 10^{-8}$ | 3 turns | $4.7 \times 10^5$ |
| 1–5 | Micromachined glass support double helix 20 | Borosilicate glass | 1.6 | 6.68 mm | $2.32 \times 10^{-8}$ | 2 turns | $9 \times 10^4$ |
| 8,9 | Micromachined flat construction double start support 80 | $SiO_2$ Or Borosilicate glass | 1.6 | 7.53 mm | $2.4 \times 10^{-8}$ | 4 turns | $1.5 \times 10^5$ |

Various methods of manufacturing crystal support 20 are possible. In one method, a glass capillary is micromachined by means of laser induced dry etching. The apparatus is similar in configuration to that described in U.S. Pat. No. 4,478,677 by Chen et al. The present invention differs from Chen in that the surface to be dry etched is cylindrical instead of flat. Therefore, a modified version of the optics is required which exposes a line at a time. The glass capillary must be slowly rotated while a spatial light modulator in the optical path changes the exposed pattern in synchronism with the angular coordinates of the capillary tube.

Another method of manufacturing support 20 is to chemically mill photomasked regions of the surface of a glass capillary. However, a continuous groove or cut in a helical pattern is needed to be formed as opposed to simple holes. This requires the application of a photomask that is correctly aligned in all three of its' cylindrical coordinates.

Crystal support 80 of FIG. 8 can be fabricated using processes used for Micro Electro Mechanical Systems (MEMs). Two dimensional MEMs structures are fabricated with flexure hinges which allows folding of the flat glass structure into a three dimensional object. Sides of the square are formed as a result of making 90 degree bends at the 3 flexure hinges. The next step is to fuse the free edges 93 and 94 at joint 96. Various methods of fusing these ends include the application of glass frit and baking the assemblies. Another method is to individually weld the ends using an electron beam or laser. The final manufacturing step is to remove the sacrificial bridges 92 by means of abrasive wateljet, laser or etching. Complete removal of these bridges is required in order to eliminate all low thermal resistance pathways between the top and bottom surfaces of the support structure.

Crystal supports 20, 60 and 80 provide a low electrical resistance pathway between the crystal resonator and the substrate or printed circuit board which connects to the oscillator circuitry and operates at a temperature close to ambient. The glass supports, which are normally electrically insulating, are made electrically conductive by evaporating or electroplating a thin metallic film on the surface of the glass. The thickness of the thin film layer is small compared to the diameter or thickness of each turn in the helix. Typically, the overall diameter of a helical coil 26 or 27 is approximately 0.035–0.040 inches (0.89–1.01 mm), and the width of each coil is approximately 0.005–0.008 inches (0.127–0.20 mm). The thickness of the metal layer 30 or 65 is 100 nm to 200 nm, so that the thermal resistance of the metallic coating is less than 10% of the thermal resistance of the glass core.

One method of applying a thin film to a helical support structure fabricated from a glass microcapillary, is to first singulate the micromachined capillary into individual units. These assemblies are then placed into a vacuum chamber with an opening to admit evaporated metal atoms such as nickel or gold. The bottom of the evacuated chamber is fabricated from a piezoelectric audio buzzer of approximately 1.0 inch (25.4 mm) diameter. This acoustical transducer is excited by an oscillator circuit so as to cause the brass backing plate of the transducer to vibrate. The brass plate faces the interior of the vacuum chamber, and the crystal supports rest on the plate under the influence of gravity. When the acoustic resonator is activated, the vertical displacements of the brass plate cause the supports to be bounced up and down. This agitation causes the springs to be exposed on various sides to the evaporated atoms, and after an extended period of time, the supports will become plated nearly uniformly on all of their interior or exterior surfaces.

The performance of the invented support structure when subjected to mechanical vibration depends on the spring constant (Hookes constant) of the support structure assembly. If higher spring stiffness than nominal is required for a particular application this can be achieved by means of tempering or strengthening of the glass support. Two approaches to strengthening are applicable to the present invention: 1) before the conductive metal plating is applied tot he spring surface, the temperature is raised to just below melting, then cooled rapidly. 2) ion replacement hardening, Na+ ion impurities in the glass are replaced by K+ ions in a chemical process.

Variations of the Preferred Embodiment(s)

One of ordinary skill in the arts of oscillator and crystal design, will realize many advantages from using the preferred embodiment. Further, one of ordinary skill in the art of making oscillators will realize that there are many different ways of accomplishing the preferred embodiment. For example, it is contemplated to make support 20 in a variety of 3 dimensional shapes such as hexagons, octagons, pentagons, or ovoids. Further, the airgaps 22 and 24 could be shaped differently such as holes or ovoids in wall 21. Although, electrical components 48 is illustrated on top surface 42A, it could be placed on bottom surface 42B.

The embodiment shows the use of vias 47 to make an electrical connection. Other electrical connections could be used such as edge connectors or a connector extending through substrate 42.

Additionally, heaters or temperature sensors could be mounted to substrate 42.

The support 20 was shown made of glass. Support 20 could be made of other insulative materials such as ceramic, polyimide, or silicon carbide.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. A high thermal resistivity crystal support for an oscillator, comprising:
    a) a glass tubular wall having at least one airgap circumferentially disposed around the wall forming at least one coil;
    b) a conductive metal layer disposed over the wall;
    c) a first end of the wall adjacently supporting and electrically connected to a crystal resonator; and
    d) a second end of the wall attached to and electrically connected to a substrate such that the crystal support forms an electrical path between the crystal resonator and the substrate, the crystal support thermally isolating the crystal resonator from the substrate.

2. The crystal support according to claim 1, wherein the crystal resonator is connected to the support by a conductive adhesive.

3. The crystal support according to claim 2, wherein the substrate is connected to the support by a conductive adhesive.

4. The crystal support according to claim 3, wherein the substrate has at least one circuit line that connects to an electronic component.

5. The crystal support according to claim 4 wherein the circuit line connects to a via in the substrate.

6. The crystal support according to claim 5 wherein the substrate is ceramic.

7. The crystal support according to claim 1, wherein the support has a bore passing therethrough.

8. A high thermal resistivity crystal support for an oscillator, comprising:
   a) a glass wire circumferentially disposed around a bore forming a plurality of coils;
   b) a conductive metal layer disposed over the wire;
   c) a first end of the support adjacently supporting and electrically connected to a crystal resonator; and
   d) a second end of the support attached to and electrically connected to a substrate such that the crystal support forms an electrical path between the crystal resonator and the substrate, the crystal support thermally isolating the crystal resonator from the substrate.

9. The crystal support according to claim 8, wherein the crystal resonator is connected to the support by a conductive adhesive.

10. The crystal support according to claim 9, wherein the substrate is connected to the support by a conductive adhesive.

11. The crystal support according to claim 10, wherein the substrate has at least one circuit line that connects to an electronic component.

12. The crystal support according to claim 11, wherein the circuit line connects to a via in the substrate.

13. The crystal support according to claim 12, wherein the substrate is ceramic.

14. A high thermal resistivity crystal support for an oscillator, comprising:
   a) an insulative tubular wall having at least one airgap disposed around the wall forming at least one helical coil;
   b) a conductive metal layer disposed over the wall;
   c) a first end of the wall adjacently supporting and electrically connected to a crystal resonator; and
   d) a second end of the wall attached to and electrically connected to a substrate such that the crystal support forms an electrical path between the crystal resonator and the substrate, the crystal support thermally isolating the crystal resonator from the substrate.

15. The crystal support according to claim 14, wherein the support is shaped like a square parallelepiped.

16. The crystal support according to claim 14, wherein the support is shaped like a cylinder having a pair of helical coils.

17. The crystal support according to claim 14, wherein the insulative support is formed from glass.

* * * * *